US008285361B2

(12) United States Patent
Guan et al.

(10) Patent No.: US 8,285,361 B2
(45) Date of Patent: Oct. 9, 2012

(54) VERTICAL FIELD MRI BREAST COIL (75) Inventors: Yiping Guan, Aurora, OH (US); Mark Richard, Cleveland, OH (US); Kevin A. Archibald, Cuyahoga Falls, OH (US)

(73) Assignee: Hitachi Medical Systems America, Inc., Twinsburg, OH (US)

( * ) Notice: Subject to any disclaimer, the term of this patent is extended or adjusted under 35 U.S.C. 154(b) by 720 days.

(21) Appl. No.: 11/939,757

(22) Filed: Nov. 14, 2007

(65) Prior Publication Data
US 2009/0124889 A1 May 14, 2009

(51) Int. Cl.
*A61B 5/055* (2006.01)
(52) U.S. Cl. ........................................ 600/422
(58) Field of Classification Search .................. 600/422
See application file for complete search history.

(56) References Cited

U.S. PATENT DOCUMENTS

| 5,363,845 A | 11/1994 | Chowdhury et al. |
| 5,416,413 A * | 5/1995 | Leussler ............... 324/318 |
| 5,602,557 A | 2/1997 | Duerr |
| 5,699,802 A | 12/1997 | Duerr |
| 6,163,717 A | 12/2000 | Su |
| 6,377,836 B1 * | 4/2002 | Arakawa et al. .............. 600/422 |
| 6,493,572 B1 * | 12/2002 | Su et al. ........................ 600/422 |
| 6,850,065 B1 | 2/2005 | Fujita et al. |
| 6,889,073 B2 | 5/2005 | Lampman et al. |
| 7,084,630 B2 | 8/2006 | Ludwig et al. |
| 7,084,631 B2 | 8/2006 | Qu et al. |
| 2005/0245805 A1 | 11/2005 | Hoppel et al. |
| 2006/0270930 A1 | 11/2006 | Brasile |
| 2007/0016003 A1 | 1/2007 | Piron et al. |

OTHER PUBLICATIONS

Jacqueline Cheng, Office Action, pp. 1 through 7, Mailed on Jun. 28, 2010, U.S. Appl. No. 11/939,745, Titled: Wing Design for RF Coil for MRI Imaging, Filed: Nov. 14, 2007, Inventor: Yiping Guan.

* cited by examiner

*Primary Examiner* — Jacqueline Cheng
(74) *Attorney, Agent, or Firm* — Ulmer & Berne LLP (57) ABSTRACT The present invention relates to a design of a radiofrequency (RF) receive coil (also commonly referred to as an imaging coil) for magnetic resonance imaging (MRI) in a vertical field MRI system of a patient's breast region. The design described herein generally includes a housing that includes two coil cups. The coil housing will generally encase the coil elements. In general, the breast coil of certain embodiments of the invention will include loop elements surrounding each side of each of the coil cups, a saddle element at the bottom of each cup, and an element that spans the width of the coil, wrapping at least partially up both sides of the coil. It is foreseen that further embodiments of the breast coil design may include additional elements.

11 Claims, 7 Drawing Sheets

VERTICAL FIELD MRI BREAST COIL

TECHNICAL FIELD

The invention relates generally to a design of a radiofrequency receive coil designed for magnetic resonance imaging of a patient's anatomy. More specifically, the invention relates to a design of a radiofrequency receive coil for magnetic resonance imaging in a vertical field magnetic resonance imaging system of a patient's breast region.

BACKGROUND OF THE INVENTION

Magnetic resonance imaging (MRI) is a medical diagnostic imaging technique used to diagnose many types of injuries and medical conditions. An MRI system includes a main magnet for generating a main magnetic field through an examination region. The main magnet is arranged such that its geometry defines the examination region. The orientation of the main magnet defines whether the MRI system is classified as a horizontal field system or a vertical field system. In a vertical field system, the static magnetic field is typically oriented in an anterior-posterior (A-P) direction relative to the prone/supine patient within the system. In a horizontal field system, the static main magnetic field is typically oriented in the head-foot (H-F) direction relative to the prone/supine patient within the system.

The main magnetic field causes the magnetic moments of a small majority of the various nuclei within the body to be aligned in a parallel or anti-parallel arrangement. The aligned magnetic moments rotate around the equilibrium axis with a frequency that is characteristic for the nuclei to be imaged. An external radiofrequency (RF) field applied by other hardware within the MRI system perturbs the magnetization from its equilibrium state. Upon termination of the application of the RF pulse, the magnetization relaxes to its initial state. During relaxation the time varying magnetic moment induces a detectable time varying voltage in the receive coil. The time varying voltage is commonly detected by a RF receive coil.

During operation of the RF receive coil, each element within the coil collects information from the time varying voltage induced by the magnetic moments within the anatomy of the patient nearest to that element. The information collected by each element is processed through the electronics within the MRI system on individual channels of the MRI system, which keep the information from each element separate throughout the imaging process. The information from each channel of the system is then processed by reconstruction software integrated with the MRI system to combine the single images from the channels to create a complete image of the anatomy of interest.

One or more RF receive coils, commonly called imaging coils, are typically placed within the vicinity of the patient during imaging. The imaging coil is typically comprised of a series of inductive and capacitive elements and operates by resonating and efficiently storing energy at what is known as the Larmor frequency. The imaging coil is comprised of at least one, and usually more than one element typically made of a continuous piece of copper in a solenoid, loop, butterfly or figure-eight (saddle), or other continuous geometric shape. The elements are positioned at various locations throughout coil to provide for the desired imaging of the patient. The design of the receive coil varies depending on whether it is designed for use within a vertical or horizontal field MRI system.

The shape, configuration and location of elements within the receive coil affect the characteristics of the coil, including the coil sensitivity, signal-to-noise ratio (SNR) and imaging field-of-view. Conventionally, the receive coil's imaging field-of-view (FoV) is defined as the distance between the two points on the coil sensitivity profile, which is a graph of the coil's sensitivity over the distance profile, where the signal drops to 80% of its peak value. The shape and design of the RF receive coil varies depending on the patient anatomy the coil is designed to imagine.

Further developments in MRI include various parallel imaging techniques. An example of a parallel imaging technique is Simultaneous Acquisition of Spatial Harmonics (SMASH). The SMASH technique uses a parallel processing algorithm to exploit spatial information inherent in a surface coil array. The result is an increase in MR image acquisition speed, resolution and/or field of view. In a similar fashion, another parallel processing algorithm is known where the acceleration of image acquisition is performed on the time domain space instead of the frequency domain space. This parallel acquisition technique is referred to as Sensitivity Encoding (SENSE). In SENSE, images are obtained by means of magnetic resonance (MR) of an object placed in a static magnetic field and includes simultaneous measurement of a number of sets of MR signals by application gradients and an array of receiver coils. The characteristics of all of these parallel imaging techniques is that the acceleration speed is directly proportional to the number of independent receivers along the direction that the image acceleration needs to be applied. Thus, the higher the number of receiver coils, the faster the acceleration speed for acquiring an image with better SNR and improved image quality.

A human breast region is one of the many types of patient anatomy that is imaged using MRI technology. Imaging a human's breast region includes the visualization of the various parts of the breast, chest wall, armpit and surrounding soft tissues. MRI examinations of the breast region are often done to visualize tumors or to evaluate the integrity of breast implants, among other reasons.

Within the art, numerous attempts have been made to provide designs for RF receive coils for breast imaging in horizontal field MRI systems, as well as vertical field MRI systems. Designs of the prior art commonly use sandwiched solenoid elements. The design of the present invention offers a new and novel solution to providing a coil design for the imaging of the breast region of a patient in a vertical field MRI system.

SUMMARY OF THE INVENTION

The present invention relates to a design of a radiofrequency (RF) receive coil (also commonly referred to as an imaging coil) for magnetic resonance imaging (MRI) in a vertical field MRI system of a patient's breast region. An embodiment of the breast coil design includes certain elements that are encased within a housing. The element and housing designs are shaped to encompass and fit in close proximity to the human chest and breast region.

Generally, the design of the breast coil described herein includes a housing that creates a body portion of the coil, with an integrated base portion of the coil, where the base rests upon the table of the MRI system, and the body of the coil rises above the table of the MRI system. The body of the coil generally includes two concave portions for the acceptance of the patient's breasts, referred to throughout this application as the cups of the coil. The patient's chest wall is supported by portions of the body of the coil that are designed to come in contact with the patient's chest wall as the patient lies on top of the coil in the prone position.

The coil elements are commonly contained within the housing of the coil. The element design of the coil described herein includes loop elements placed to provide coverage of all four sides of each of the patient's breasts. The loop elements will encompass all four sides of each of the two coil cups. One loop element may be positioned between the two cups, or within the inside of one of the cups placed on the side wall closest to the other cup, and may encompass the inside of both cups. In other words, and as shown in the figures described hereafter, a loop element will exist on each of the four sides of both coil cups, with one loop element being shared to cover the inside of both coil cups. In addition to the loop elements the coil design described herein will generally include elements placed to provide coverage of the front portions of the patient's breasts. These elements will generally include a saddle element placed in the bottom of each of the coil cups. The coil will further include one or more elements to provide coverage of the sides of the patient's breasts into the armpit and side region of the patient. This one or more element will commonly span the width of the patient's front and wrap up onto both of the patient's sides. It is foreseen that the coil design of the present invention may include more elements than those listed here. Examples of designs using further elements are described below.

It is an object of this invention to provide a design for a RF receive coil for MR imaging of a patient's breast region in a vertical field MRI system.

These and other objects of the present invention will become more readily apparent from a reading of the following detailed description taken in conjunction with the accompanying drawings wherein like reference numerals indicate similar parts, and with further reference to the appended claims.

BRIEF DESCRIPTION OF THE DRAWINGS

The preferred embodiment of the invention, illustrative of the best mode in which applicant has contemplated applying the principals is set forth in the following description and is shown in the drawings and is particularly and distinctly pointed out and set forth in the appended claims. The invention may take physical form in certain parts and arrangements of parts, numerous embodiments of which will be described in detail in the specification and illustrated in the accompanying drawings which form a part hereof, and wherein:

DETAILED DESCRIPTION OF THE INVENTION

Referring now to the drawings wherein the showings are for purposes of illustrating numerous embodiments of the invention only and not for purposes of limiting the same, the figures illustrate the novel idea of a design of a radiofrequency (RF) receive coil (also commonly referred to as an imaging coil) for magnetic resonance imaging (MRI) in a vertical field MRI system of a patient's breast region. When referring to the breast region, the patient's breast region will include not only the patient's breasts but also the chest wall and surrounding tissues, as well as the armpit and upper side regions and associated tissues.

Figure 1:
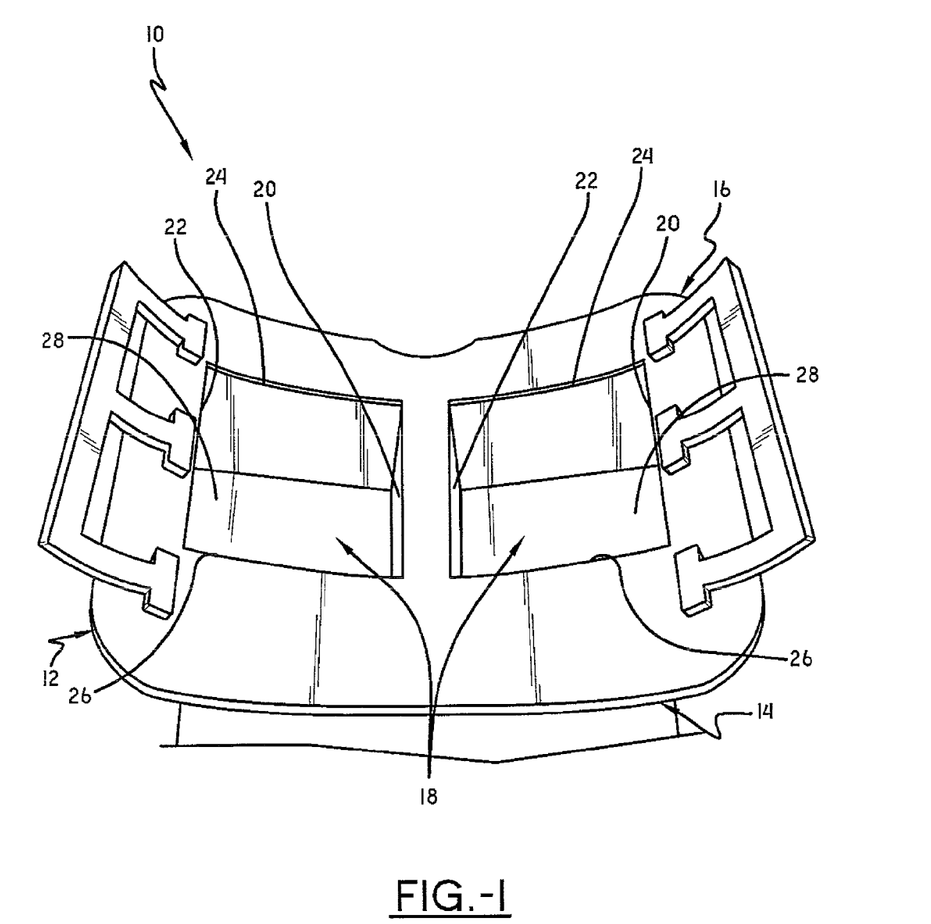
FIG. 1 is a top perspective view of an embodiment of a coil of the present invention.

As illustrated in FIG. 1, generally, the design of breast coil 10 described herein includes housing 12 that defines integrated coil base 14 and body portion 16. Base 14 of housing 12 will rest on the table of the MRI system. Housing 12 will generally provide portions designed to contact and support the chest wall of the patient lying in the prone position on top of the coil design. Housing generally includes two concave portions designed to accept the patient's breasts, commonly called coil cups 18. Commonly, the coil cups will be defined by right side 20, left side 22, head side 24, foot side 26, and bottom side 28, and will be generally square or rectangular shaped. However, it is foreseen that the coil cups are not limited to a square or rectangular shape. The coil cups may be n-sided, or even circular. For the purposes of the present application, a coil having circular shaped cups will be seen as having an infinite number of sides, thus having more than the common four sides. It is also foreseen that coil cups 18 may be enclosed on all sides except the top, or the coil cups may be generally open on the sides, such that no wall exists where no element is present.

The coil housing will generally encase the coil elements. In general, the breast coil of certain embodiments of the invention will include loop elements surrounding each side of each of the coil cups, a saddle element at the bottom of each cup, and an element that spans the width of the coil, wrapping at least partially up both sides of the coil. The element that wraps up at least a portion of the sides of the coil may be enclosed in a rigid housing of the coil, or may be enclosed in a flexible housing that allows the element to be positioned at a closer distance to the patient being imaged in the coil. When the coil cups are four sided, a minimum of five loop elements will be necessary to cover all sides of both coil cups one loop element positioned on the left side of the left cup, one loop element positioned between the left and right cups (covering the right side of the left cup and the left side of the right cup), one loop element positioned on the right side of the right cup, one large loop element covering the head side of both the left and right cup, and one large loop element covering the foot side of both the left and right cup.

Figure 2:
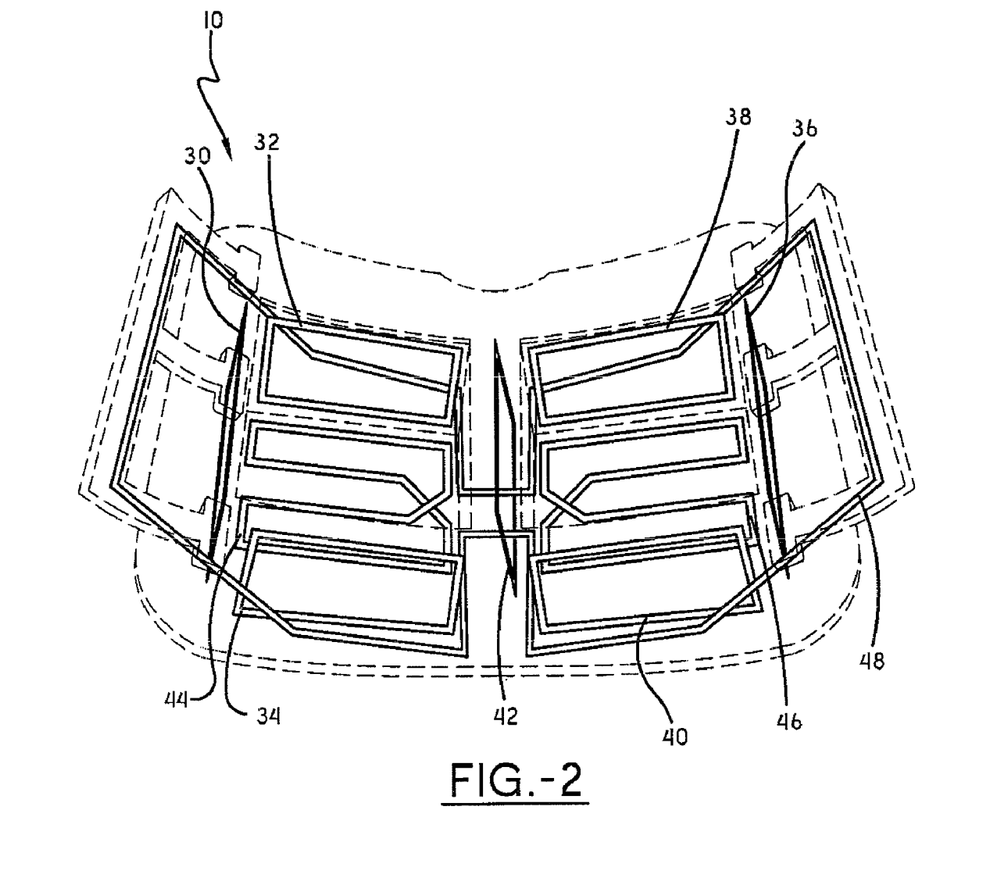
FIG. 2 is a cross-sectional top perspective view of a ten element embodiment of a coil of the present invention.

One certain embodiment of the design of breast coil 10, illustrated in FIG. 2, includes ten elements. The ten elements include seven loop elements positioned as follows: single loop element 30 is positioned on the left side of the left coil cup, single loop element 32 is positioned on the head side of the left coil cup, single loop element 34 is positioned on the foot side of the left coil cup, single loop element 36 is positioned on the right side of the right coil cup, signal loop element 38 is positioned on the head side of the right coil cup, single loop element 40 is positioned on the foot side of the right coil cup, and single loop element 42 is shared between the right side of the left coil cup and the left side of the right coil cup. Shared loop element 42 is positioned either on the right side of the left coil cup, on the left side of the right coil cup, or directly between the coil cups. This embodiment of the breast coil design further includes saddle element 44 positioned on the bottom of the left coil cup, and saddle element 46 positioned on the bottom of the right coil cup. This embodiment further includes left-right counter-rotational-coil element 48 that spans across the bottom of the coil and wraps up at least a portion of the left and right sides of the coil wall.

Figure 3:
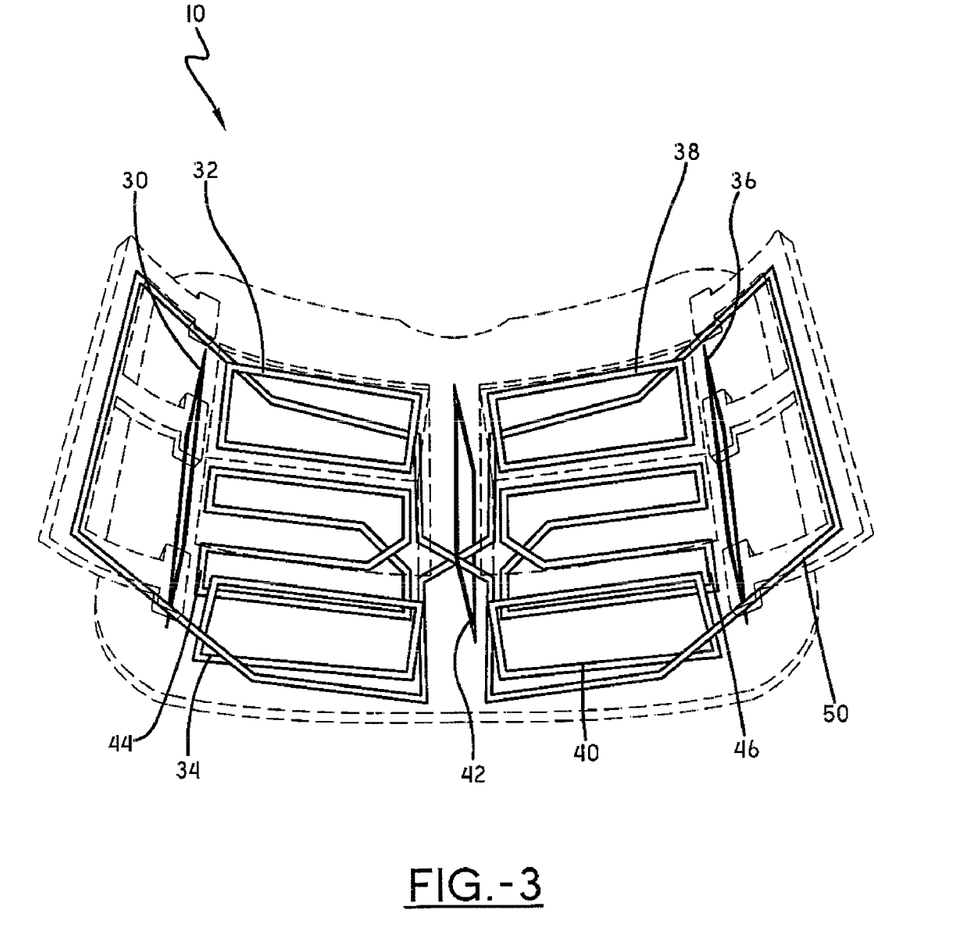
FIG. 3 is a cross-sectional top perspective view of a further ten element embodiment of a coil of the present invention.

In further embodiments of the coil a ten element design may also be used. A certain embodiment, shown in FIG. 3, includes the same elements and element positioning of the previous embodiment, however saddle coil 50 replaces the left-right counter-rotational-coil element (48 in FIG. 2). Yet further embodiments may utilize loop elements or counter-rotational-coil elements for the two saddle elements.

Figure 4:
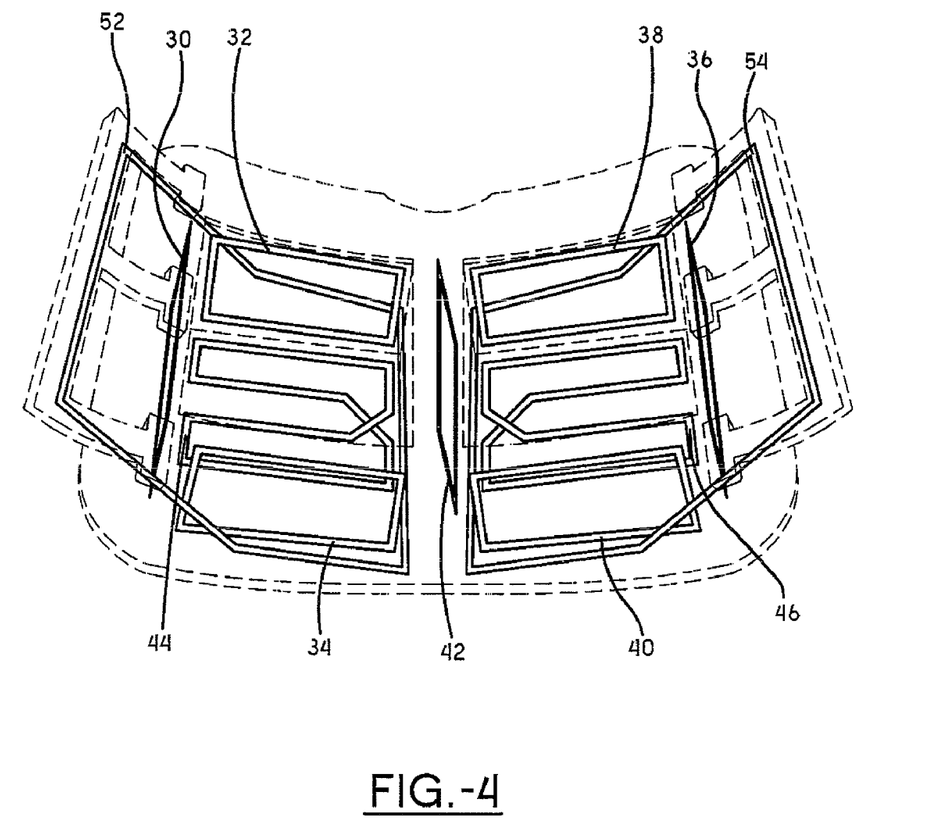
FIG. 4 is a cross-sectional top perspective view of an eleven element embodiment of a coil of the present invention.

A further embodiment of the breast coil design, as illustrated in FIG. 4, includes eleven elements. The eleven elements include seven loop elements positioned as follows: single loop element 30 is positioned on the left side of the left coil cup, single loop element 32 is positioned on the head side of the left coil cup, single loop element 34 is positioned on the foot side of the left coil cup, single loop element 36 is positioned on the right side of the right coil cup, single loop element 38 is positioned on the head side of the right coil cup, single loop element 40 is positioned on the foot side of the right coil cup, and single loop element 42 is shared between the right side of the left coil cup and the left side of the right coil cup. Similarly to the previous embodiments, shared loop element 42 may be positioned on the right side of the left coil cup, on the left side of the right coil cup, or directly between the coil cups. This embodiment of the breast coil design further includes saddle element 44 positioned on the bottom of the left coil cup, and saddle element 46 positioned on the bottom of the right coil cup. The eleven element design further includes two tilted loop elements 52 and 54. Tilted loop element 52 is positioned to encompass the left half of the coil, providing coverage to the patient's left side, and tilted loop element 54 is positioned to encompass the right half of the coil, providing coverage to the patient's right side. It is foreseen that the tilted loop elements may be replaced by a plurality of loop elements.

Figure 5:
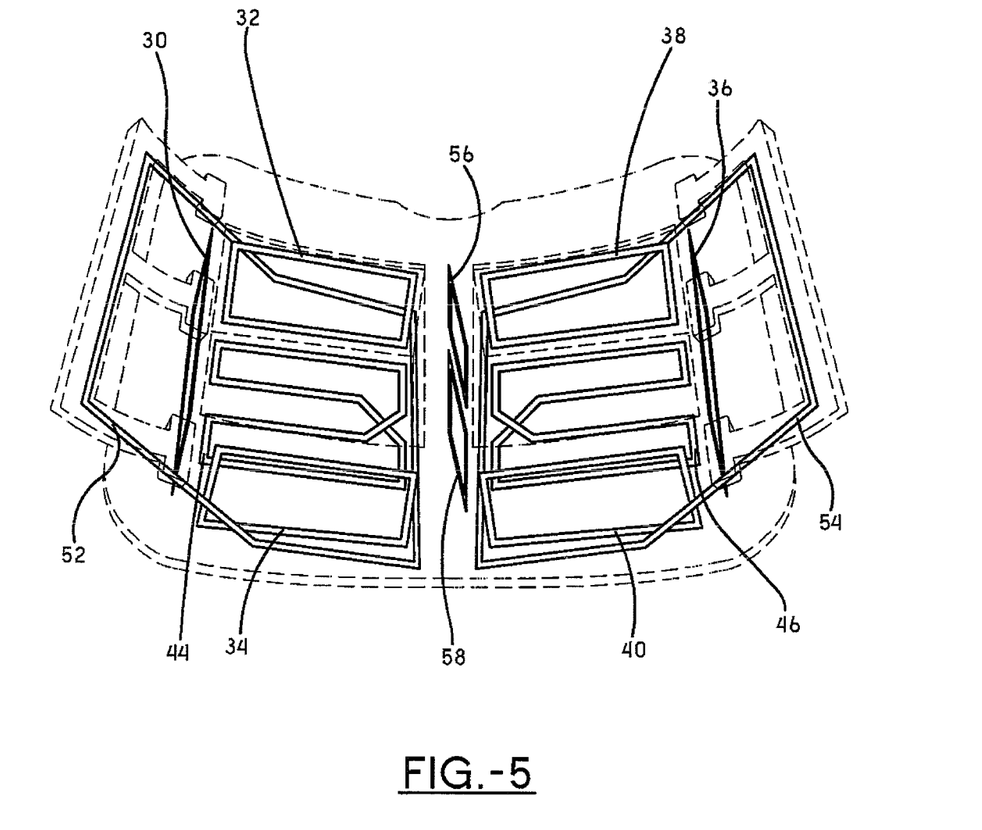
FIG. 5 is a cross-sectional top perspective view of a twelve element embodiment of a coil of the present invention.

Yet a further embodiment of the invention includes twelve elements, as illustrated in FIG. 5. The twelve-element design includes eight loop elements, positioned as follows: single loop element 30 is positioned on the left side of the left coil cup, single loop element 32 is positioned on the head side of the left coil cup, single loop element 34 is positioned on the foot side of the left coil cup, single loop element 36 is positioned on the right side of the right coil cup, single loop element 38 is positioned on the head side of the right coil cup, single loop element 40 is positioned on the foot side of the right coil cup, and two loop elements 56 and 58 are shared between the right side of the left coil cup and the left side of the right coil cup. The two shared loop elements are positioned in a parallel manner so one of the shared loop elements is nearest the head direction of the coil and the other is nearest the foot direction of the coil. Shared loop elements 56 and 58 are positioned either on the right side of the left coil cup, on the left side of the right coil cup, or directly between the coil cups. This embodiment of the breast coil design further includes saddle element 44 positioned on the bottom of the left coil cup, and saddle element 46 positioned on the bottom of the right coil cup. The twelve element design further includes two tilted loop elements 52 and 54. Tilted loop element 52 is positioned to encompass the left half of the coil, providing coverage to the patient's left side, and tilted loop element 54 is positioned to encompass the right half of the coil, providing coverage to the patient's right side. It is foreseen that the tilted loop elements may be replaced by a plurality of loop elements. It is further foreseen that other embodiments similar to the twelve-element embodiment may replace the two tilted loop elements with a single saddle element or a single left-right counter-rotational coil element.

Figure 6:
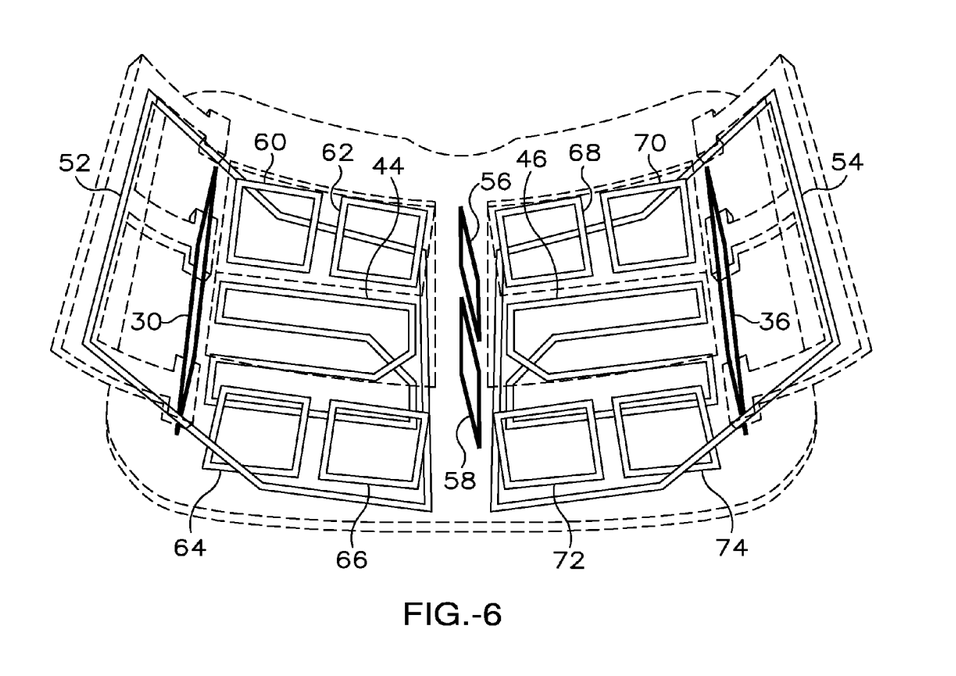
FIG. 6 is a cross-sectional top perspective view of a sixteen element embodiment of a coil of the present invention.

Yet another embodiment of the invention includes sixteen elements, as illustrated in FIG. 6. The sixteen element design includes twelve loop elements, positioned as follows: single loop element 30 is positioned on the left side of the left coil cup, two loop elements 60 and 62 are positioned on the head side of the left coil cup, two loop elements 64 and 66 are positioned on the foot side of the left coil cup, single loop element 36 is positioned on the right side of the right coil cup, two loop elements 68 and 70 are positioned on the head side of the right coil cup, two loop elements 72 and 74 are positioned on the foot side of the right coil cup, and two loop elements 56 and 58 are shared between the right side of the left coil cup and the left side of the right coil cup. The two shared loop elements are positioned in a parallel manner so shared loop element 58 is nearest the head direction of the coil and shared loop element 56 is nearest the foot direction of the coil. Shared loop elements 56 and 58 are positioned either on the right side of the left coil cup, on the left side of the right coil cup, or directly between the coil cups. This embodiment of the breast coil design further includes saddle element 44 positioned on the bottom of the left coil cup, and saddle element 46 positioned on the bottom of the right coil cup. The sixteen element design further includes two tilted loop elements 52 and 54. Tilted loop element 52 is positioned to encompass the left half of the coil, providing coverage to the patient's left side, and tilted loop element 54 is positioned to encompass the right half of the coil, providing coverage to the patient's right side. It is foreseen that the tilted loop elements may be replaced by a plurality of loop elements. It is further foreseen that other embodiments similar to this sixteen element embodiment may replace the two tilted loop elements with a single saddle element or a single left-right counter-rotational-coil element.

Similarly to the sixteen element embodiment, an eighteen element embodiment may use two loop elements on the left side of the left coil cup and two loop elements on the right side of the right coil cup. Other embodiments similar to the eighteen element embodiment may replace the two tilted loop elements with a single saddle element or a single left-right counter-rotational coil element.

Figure 7:
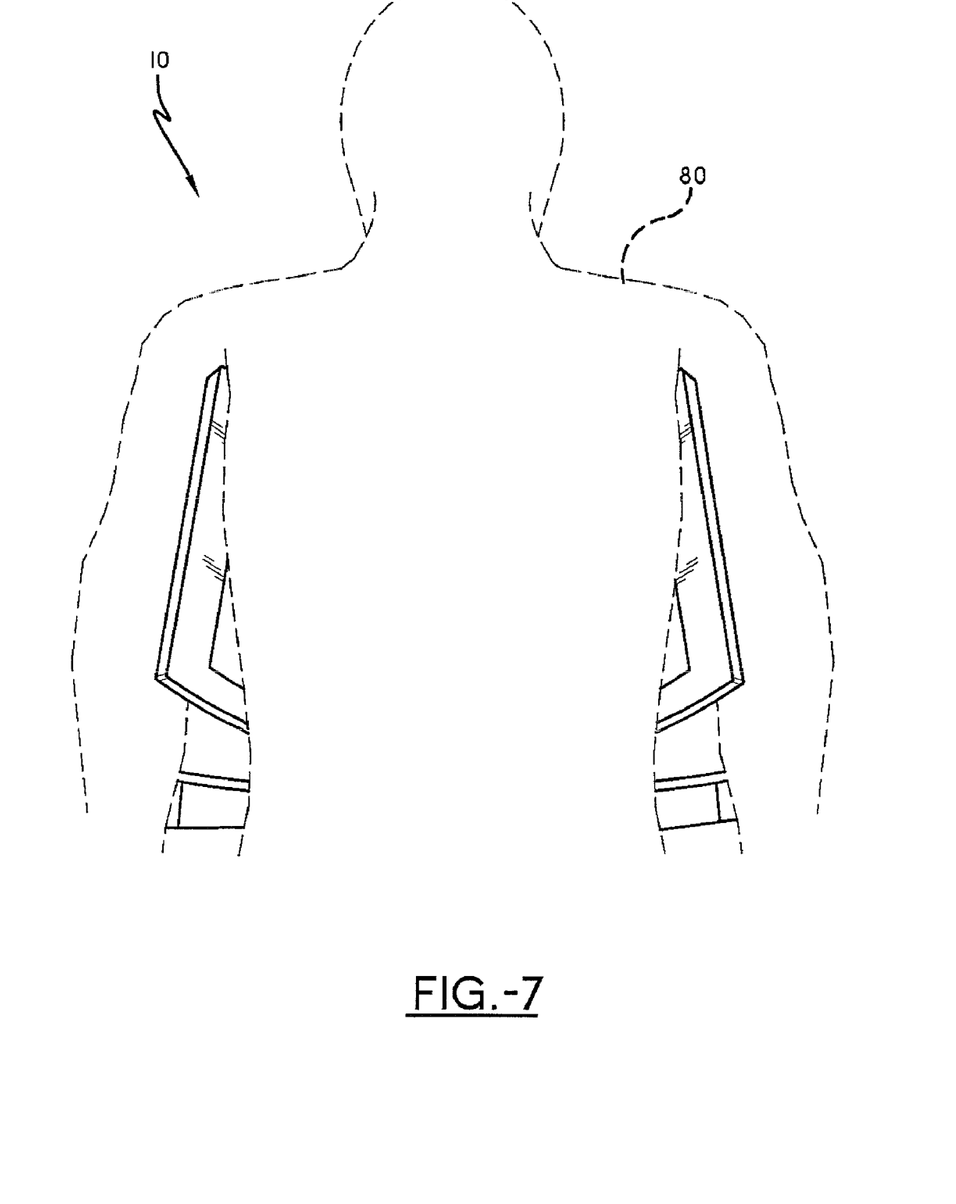
FIG. 7 is a top perspective view of a patient positioned on a coil of the present invention.

Proper positioning of breast coil 10 on patient's breast region is illustrated in FIG. 7. When coil 10 is properly positioned on a patient's anatomy for MR imaging of breast region using coil 10, patient 80 lies face down on top of coil 10 in the prone position. The patient's breasts are positioned within the coil cups, and are ideally, but not necessarily, centered within. There may be distance between the walls of the coil cups and the patient's breasts, or they may fit snugly, depending on the size of the patient's breasts. The patient is supported by the portions of the coil housing that are designed to contact with the patient's chest wall. Certain embodiments of the coil may provide a head rest for the patient to rest their head on, or standard or specially designed pillows may be provided for the patient's head.

The design of the breast coil of the present invention offers many advantages over past designs. The element design provides for optimum imaging capabilities of the breast coil when used in an MRI system having a vertical field. Furthermore, the number of elements used in the coil design offers parallel imaging capabilities in all three directions (right-left, anterior-posterior, superior-inferior).

The elements in the design of the breast coil are commonly formed using copper tape, as is known by one ordinarily skilled in the art. The elements can be constructed using a continuous single piece of copper tape, or may be formed using many pieces of copper tape electrically connected to form a continuous signal path. The width, thickness and number of turns of copper tape used are chosen for optimized sensitivity of the coil, as is commonly known in the art, and may vary depending on the individual system the coil is being used in conjunction with. The elements may be, but are not necessarily, mounted on a frame structure to support the elements and ensure the elements are not bent or repositioned during imaging use of the coil. The frame structure will commonly be constructed of a plastic material. At least a portion of the frame may be flexible enough to prevent cracking of the frame or elements during use of the coil, however should return to its original shape when flexed. The design may also include electronic components in electrical connection with the elements of the design. These electronic components transmit the signal generated within the coil to the other components of the MR system to create the desired images of the patient.

The breast coil design of the present invention will commonly be enclosed in a housing structure. While the housing structure is not limited to any particular design, the housing structure will commonly be constructed of a combination of a rigid material, such as a hard plastic or polymer, and portions of the coil may be constructed of a flexible material, such as a foam, rubberized polymer, or other similar material. There is no limitation, however, that the housing must be entirely rigid, or partially flexible, as the housing may also be constructed solely from a rigid material such as a hard plastic. The housing will be of any material that can adequately protect the internal elements and associated electronics of the coil from any external pollutants such as moisture, dust and the like, with the only limitation being that the material used to construct the housing must not affect the MR images created by the coil.

The housing may be created from more than one type of material. For example, the housing may be constructed from a flexible foam, and also covered in a second material such as a vinyl or plastic that allows for easy cleaning of the coil. Furthermore, a different material may be used to house the more sensitive electronics of the coil, such that while a rigid plastic and a flexible foam may be used for the main body of the coil housing, a different rigid plastic may be used to protect the electronics located at a centralized location of the coil. It is also foreseen that the electronics may be located in the same housing as the coil elements, below the coil elements, between the MRI table and the elements, or elsewhere in the coil. In most embodiments the housing structure will be shaped to conform with not only the design of the breast coil of this invention, but also to the general shape of the patient's chest and breast region to provide a comfortable fit during imaging of the patient.

In a preferred embodiment of the design of this invention, the coil of this design can be used to image a significant majority of patients' breast and chest regions, and does not require different sized coils to obtain optimal imaging of patients. It is foreseen however, that a larger or smaller size coil may be created using the design of this invention to provide optimal imaging for very large or very small patients.

Described herein is a magnetic resonance imaging radiofrequency receive coil for imaging the human breast region of a patient, the coil including a housing, wherein the housing includes a left cup portion and a right cup portion, both the left and right cup portions being defined by a left side, a right side, a head side, a foot side and a bottom side, and the housing further defining a left and a right side of the coil. The coil also includes at least seven loop elements, wherein at least one of the at least seven loop elements is positioned on the left side of the left cup portion, at least one of the at least seven loop elements is positioned on the right side of the right cup portion; at least one of the at least seven loop elements is positioned between the left cup portion and the right cup portion; at least one of the at least seven loop elements is positioned on the head side of the right cup portion, at least one of the at least seven loop elements is positioned on the head side of the left cup portion; at least one of the at least seven loop elements is positioned on the foot side of the right cup portion; and at least one of the at least seven loop elements is positioned on the foot side of the left cup portion. Also included in the coil of this embodiment is at least two elements, wherein at least one of the at least two elements is positioned on the bottom side of the left cup portion and another at least one of the at least two elements is positioned on the bottom side of the right cup portion. In certain embodiments of the invention the housing defines a base portion of the coil and a body portion of the coil, wherein the base portion is integrated with the body portion. In certain embodiments of the invention the at least two elements on the bottom side of the coil cups are chosen from a group consisting of: saddle elements, counter-rotational elements; and loop elements. In other embodiments of the invention the coil includes at least one element positioned to span across the coil and wrap up at least a portion of the left and right sides of the coil. In certain embodiments that element may be chosen from a group consisting of: a saddle element, a counter-rotational coil element, and a loop element.

Also described herein is a magnetic resonance imaging radiofrequency receive coil for imaging the human breast region of a patient, the coil including a housing, wherein the housing includes a left cup portion and a right cup portion, both the left and right cup portions being defined by at least four sides and a bottom, and the housing further defining a left and a right side of the coil. The coil also includes at least five loop elements positioned to cover all sides of the left and right cup portions; and at least two elements positioned to cover the bottoms of said left and right cup portions. Also included is at least one element positioned to cover both of the left and right sides of the coil. In some embodiments of the coil the at least two elements at the bottoms of the left and right cup portions are chosen from a group consisting of: saddle elements, counter-rotational elements; and loop elements. In other embodiments the at least one element covering both of the left and right sides of the coil is chosen from a group consisting of: a saddle element, a counter-rotational coil element, and a loop element.

Further described herein is a magnetic resonance imaging radiofrequency receive coil for imaging the human breast region of a patient, the coil including a housing, wherein the housing includes a left cup portion and a right cup portion, both the left and right cup portions being defined by a left side, a right side, a head side, a foot side and a bottom side, and the housing further defining a left and a right side of the coil. The coil also includes at least seven loop elements, wherein at least one of the at least seven loop elements is positioned on the left side of the left cup portion, at least one of the at least seven loop elements is positioned on the right side of the right cup portion; at least one of the at least seven loop elements is positioned between the left cup portion and the right cup portion; at least one of the at least seven loop elements is positioned on the head side of the right cup portion, at least one of the at least seven loop elements is positioned on the head side of the left cup portion; at least one of the at least seven loop elements is positioned on the foot side of the right cup portion; and at least one of the at least seven loop elements is positioned on the foot side of the left cup portion. The coil further includes at least two saddle elements, wherein at least one of the at least two saddle elements is positioned on the bottom side of the left cup portion and another at least one of the at least two saddle elements is positioned on the bottom side of the right cup portion. The coil further includes at least one element positioned to span across the coil and wrap up at least a portion of the left and right sides of the coil. In certain embodiments of the coil the housing defines a base portion of the coil and a body portion of said coil, wherein the base portion is integrated with the body portion. In certain embodiments of the coil the at least one element that wraps up at least a portion of the left and right sides of the coil is chosen from a group consisting of: a saddle element, a counter-rotational coil element, and a loop element.

In the foregoing description, certain terms have been used for brevity, clearness, illustration and understanding; but no unnecessary limitations are to be implied therefrom beyond the requirements of the prior art, because such terms are used for descriptive purposes and are intended to be broadly construed. Moreover, this invention has been described in detail with reference to specific embodiments thereof, including the respective best modes for carrying out each embodiment. It shall be understood that these illustrations are by way of example and not by way of limitation.

What is claimed is:

1. A magnetic resonance imaging radiofrequency receive coil for imaging the human breast region of a patient in a vertical-field MRI system, said coil comprising:
   (a) a housing, wherein said housing includes a left cup portion and a right cup portion, both said left and right cup portions being defined by a left side, a right side, a head side, a foot side and a bottom side, and said housing further defining a left and a right side of the coil;
   (b) at least seven loop elements, wherein at least one of said at least seven loop elements is positioned on the left side of the left cup portion, at least one of said at least seven loop elements is positioned on the right side of the right cup portion; at least one of said at least seven loop elements is positioned between said left cup portion and said right cup portion; at least one of said at least seven loop elements is positioned on the head side of the right cup portion, at least one of said at least seven loop elements is positioned on the head side of the left cup portion; at least one of said at least seven loop elements is positioned on the foot side of the right cup portion; and at least one of said at least seven loop elements is positioned on the foot side of the left cup portion; and
   (c) at least two elements, wherein at least one of said at least two elements is positioned on the bottom side of the left cup portion and another at least one of said at least two elements is positioned on the bottom side of the right cup portion; wherein;
   said at least seven loop elements and said at least two elements are arranged to facilitate imaging of the human breast region of a patient in a vertical-field MRI system; and
   said at least seven loop elements and said at least two elements cooperate to facilitate parallel imaging.

2. The receive coil of claim 1 wherein said housing defines a base portion of said coil and a body portion of said coil, wherein said base portion is integrated with said body portion.

3. The receive coil of claim 1 wherein said at least two elements are chosen from a group consisting of: saddle elements, counter-rotational elements; and loop elements.

4. The receive coil of claim 1 which further comprises only one element positioned to span across the coil and wrap up at least a portion of the left and right sides of the coil.

5. The receive coil of claim 4 wherein said only one element is chosen from a group consisting of: a saddle element, a counter-rotational coil element, and a loop element.

6. A magnetic resonance imaging radiofrequency receive coil for imaging the human breast region of a patient in a vertical-field MRI system, said coil comprising:
   (a) a housing, wherein said housing includes a left cup portion and a right cup portion, both said left and right cup portions being defined by at least four sides and a bottom, and said housing further defining a left and a right side of the coil;
   (b) at least five loop elements positioned to cover all sides of said left and right cup portions;
   (c) at least two elements positioned to cover said bottoms of said left and right cup portions; and
   (d) at least one element positioned to cover both of said left and right sides of the coil; wherein:
   said at least five loop elements, said at least two elements positioned to cover said bottoms if said left and right cup portions, and said only one element positioned to cover both left and right side of the coil are arranged to facilitate imaging of the human breast region of a patient in a vertical-field MRI system; and
   said at least five loop elements, said at least two elements, and said only one element cooperate to facilitate parallel imaging.

7. The receive coil of claim 6 wherein said at least two elements are chosen from a group consisting of: saddle elements, counter-rotational elements; and loop elements.

8. The receive coil of claim 6 wherein said at least one element is chosen from a group consisting of: a saddle element, a counter-rotational coil element, and a loop element.

9. A magnetic resonance imaging radiofrequency receive coil for imaging the human breast region of a patient in a vertical-field MRI system, said coil comprising:
   (a) a housing, wherein said housing includes a left cup portion and a right cup portion, both said left and right cup portions being defined by a left side, a right side, a head side, a foot side and a bottom side, and said housing further defining a left and a right side of the coil;
   (b) at least seven loop elements, wherein at least one of said at least seven loop elements is positioned on the left side of the left cup portion, at least one of said at least seven loop elements is positioned on the right side of the right cup portion; at least one of said at least seven loop elements is positioned between said left cup portion and said right cup portion; at least one of said at least seven loop elements is positioned on the head side of the right cup portion, at least one of said at least seven loop elements is positioned on the head side of the left cup portion; at least one of said at least seven loop elements is positioned on the foot side of the right cup portion; and at least one of said at least seven loop elements is positioned on the foot side of the left cup portion;
   (c) at least two saddle elements, wherein at least one of said at least two saddle elements is positioned on the bottom side of the left cup portion and another at least one of said at least two saddle elements is positioned on the bottom side of the right cup portion; and
   (d) only one element positioned to span across the coil and wrap up at least a portion of the left and right sides of the coil; wherein:
   said at least seven loop elements, said at least two saddle elements, and said only one element positioned to span across the coil are arranged to facilitate imaging of the human breast region of a patient in a vertical-field MRI system; and said at least seven loop elements, said at least two saddle elements, and said only one element cooperate to facilitate parallel imaging.

10. The receive coil of claim 9 wherein said housing defines a base portion of said coil and a body portion of said coil, wherein said base portion is integrated with said body portion.

11. The receive coil of claim 9 wherein said at least one element is chosen from a group consisting of: a saddle element, a counter-rotational coil element, and a loop element.

* * * * *

UNITED STATES PATENT AND TRADEMARK OFFICE
CERTIFICATE OF CORRECTION

PATENT NO. : 8,285,361 B2
APPLICATION NO. : 11/939757
DATED : October 9, 2012
INVENTOR(S) : Yiping Guan et al.

Page 1 of 1

It is certified that error appears in the above-identified patent and that said Letters Patent is hereby corrected as shown below:

Column 9, line 48, change "wherein;" to --wherein:--;
Column 10, line 13, change "at least" to --only--; and
Column 10, line 16, change "if" to --of--.

Signed and Sealed this
Twenty-second Day of January, 2013

David J. Kappos
*Director of the United States Patent and Trademark Office*